(12) United States Patent
Bauer

(10) Patent No.: US 10,697,543 B2
(45) Date of Patent: Jun. 30, 2020

(54) SLIDING ELEMENT, IN PARTICULAR PISTON RING, AND METHOD FOR PRODUCING THE SAME

(71) Applicant: FEDERAL-MOGUL BURSCHEID GMBH, Burscheid (DE)

(72) Inventor: Christiane Bauer, Burscheid (DE)

(73) Assignee: Federal-Mogul Burscheid GmbH, Burscheid (DE)

( * ) Notice: Subject to any disclaimer, the term of this patent is extended or adjusted under 35 U.S.C. 154(b) by 35 days.

(21) Appl. No.: 15/325,860

(22) PCT Filed: Jul. 15, 2015

(86) PCT No.: PCT/EP2015/066152
§ 371 (c)(1),
(2) Date: Jan. 12, 2017

(87) PCT Pub. No.: WO2016/008920
PCT Pub. Date: Jan. 21, 2016

(65) Prior Publication Data
US 2017/0159816 A1    Jun. 8, 2017

(30) Foreign Application Priority Data

Jul. 16, 2014    (DE) .................. 10 2014 213 822

(51) Int. Cl.
| | | |
|---|---|---|
| F16J 9/26 | (2006.01) | |
| C23C 28/00 | (2006.01) | |
| C23C 14/06 | (2006.01) | |
| C23C 14/16 | (2006.01) | |
| C25D 7/00 | (2006.01) | |

(52) U.S. Cl.
CPC .............. *F16J 9/26* (2013.01); *C23C 14/0611* (2013.01); *C23C 14/0641* (2013.01); *C23C 14/16* (2013.01); *C23C 28/322* (2013.01); *C23C 28/34* (2013.01); *C23C 28/343* (2013.01); *C23C 28/347* (2013.01); *C25D 7/00* (2013.01)

(58) Field of Classification Search
USPC ............ 204/192.1, 192.15, 192.16; 428/336, 428/408, 457, 469, 472, 698; 277/442
See application file for complete search history.

(56) References Cited

U.S. PATENT DOCUMENTS

| | | | | |
|---|---|---|---|---|
| 4,557,492 A | * | 12/1985 | Tsuchiya ................. | F16J 9/26 277/443 |
| 5,582,414 A | * | 12/1996 | Miyazaki ............ | C23C 14/0641 428/698 |
| 6,508,473 B1 | * | 1/2003 | Tanaka ................ | C23C 14/0641 277/442 |
| 2008/0095939 A1 | * | 4/2008 | Fischer ............... | C23C 14/0641 427/255.394 |
| 2009/0001669 A1 | * | 1/2009 | Hoppe ...................... | F16J 9/26 277/442 |
| 2010/0044967 A1 | | 2/2010 | Esser et al. | |
| 2010/0044968 A1 | | 2/2010 | Fischer et al. | |
| 2010/0044969 A1 | | 2/2010 | Fischer et al. | |
| 2010/0117304 A1 | | 5/2010 | Esser et al. | |
| 2010/0171272 A1 | | 7/2010 | Hoppe et al. | |
| 2010/0187765 A1 | | 7/2010 | Hoppe et al. | |
| 2013/0075977 A1 | | 3/2013 | An | |
| 2013/0140776 A1 | | 6/2013 | Kennedy | |
| 2013/0316156 A1 | | 11/2013 | Kennedy et al. | |
| 2013/0328274 A1 | | 12/2013 | Sugiura et al. | |
| 2014/0008874 A1 | | 1/2014 | Esser | |
| 2014/0217677 A1 | | 8/2014 | Smith et al. | |
| 2014/0353923 A1 | | 12/2014 | Lammers et al. | |
| 2015/0292622 A1 | | 10/2015 | Kennedy et al. | |

FOREIGN PATENT DOCUMENTS

| | | |
|---|---|---|
| CN | 103016200 A | 4/2013 |
| CN | 103836186 A | 6/2014 |
| DE | 10221800 A1 | 12/2003 |
| DE | 102004032403 B3 | 12/2005 |
| DE | 102005011438 B3 | 5/2006 |
| DE | 102005023627 A1 | 11/2006 |
| DE | 102006003480 B3 | 7/2007 |
| DE | 102006046917 B3 | 2/2008 |
| DE | 102006046915 B3 | 3/2008 |
| DE | 102007007962 B3 | 5/2008 |

(Continued)

OTHER PUBLICATIONS

International Search Report, dated Oct. 2, 2015 (PCT/EP2015/066152).

(Continued)

*Primary Examiner* — Archene A Turner
(74) *Attorney, Agent, or Firm* — Robert L. Stearns; Dickinson Wright, PLLC

(57) ABSTRACT

A sliding element, in particular a piston ring has an outer circumferential running surface of the piston ring, has no nitriding layer, preferable no surface hardening the running surface has as an outermost layer, which differs from the intermediate layer, a DLC layer or a metal-based nitride layer, preferable a metal nitride layer, preferably a CrN layer. Provided between the substrate of the sliding element and the DLC layer there is at least one metal-containing intermediate layer, preferably a metal layer, particularly preferable a chromium layer, and at least one further surface of the sliding element, preferably the piston ring flanks, is surface-hardened, preferably has a nitriding layer.

11 Claims, No Drawings

(56) References Cited

FOREIGN PATENT DOCUMENTS

| | | | |
|---|---|---|---|
| DE | 102007007960 A1 | | 8/2008 |
| DE | 102007027245 A1 | | 12/2008 |
| DE | 102007035502 A1 | | 2/2009 |
| DE | 102008017583 A1 | | 10/2009 |
| DE | 102011014483 B3 | | 5/2012 |
| DE | 102011003254 A1 | | 8/2012 |
| DE | 102012200378 A1 | | 7/2013 |
| DE | 112012001018 T5 | | 12/2013 |
| GB | 662213 | * | 12/1951 |
| GB | 2136089 A | | 9/1984 |
| JP | 62-120471 | * | 6/1987 |
| JP | 08-312779 | * | 11/1996 |
| JP | 2007-271072 | * | 10/2007 |
| JP | 2007298103 A | | 11/2007 |
| RU | 2173356 C1 | | 3/1991 |
| RU | 2432418 C2 | | 5/2008 |
| WO | 03098079 A1 | | 11/2003 |
| WO | 2012072483 A1 | | 6/2012 |
| WO | 2014068040 A1 | | 5/2014 |
| WO | 2014106175 A1 | | 7/2014 |

OTHER PUBLICATIONS

Carbon Films: Basic knowledge, film types and properties, VDI Standard 2840, The Association of German Engineers, Jun. 2012.
Anonymous, "Online piston ring handbook", Aug. 2008 (Aug. 2008), pp. 2, 44, 45, XP055282876, Federal-Mogul Burscheid GmbH, retrievable at: http://korihandbook.federalmogul.com/de/ (retrieved on Jun. 22, 2016).

* cited by examiner

SLIDING ELEMENT, IN PARTICULAR PISTON RING, AND METHOD FOR PRODUCING THE SAME

BACKGROUND OF THE INVENTION

1. Technical Field

The invention relates to a sliding element, in particular a piston ring, which exhibits good overall wear resistance as well as favorable tribological properties in the region of the running surface, and to a method for producing the same.

2. Related Art

When reducing the carbon dioxide emissions of internal combustion engines, fuel consumption plays a key role. This is influenced, inter alia, also by the frictional losses of the sliding elements in the engine, in particular in the region of the pistons. The sliding elements, for example piston rings, have running surfaces at which they are in sliding contact with a friction partner. This tribological system is complex and is significantly determined by the material pairing of the friction partners.

Therefore, there is a need for sliding elements in internal combustion engines, which exhibit the most favorable friction behaviour possible throughout the entire service life. However, especially with modern engines, high thermal and mechanical loads occur at the sliding elements.

The sliding elements, e.g. piston rings, pistons or cylinder liners in internal combustion engines are therefore supposed to have low coefficients of friction as well as high resistance to wear throughout a long service life.

Piston rings are known from the prior art, the flanks of which are nitrided in part or in full and the running surfaces of which have a different coating at least in part.

DE 102 21 800 A1 discloses a steel piston ring having a running surface, an inner surface as well as upper and lower flanks provided therebetween, with the running surface being provided at least in part with a thermal spray layer as running surface coating and a nitrided layer created by plasma nitriding being provided at least on the flanks.

U.S. Pat. No. 6,508,473 B1 describes a piston ring having a nitrided layer on the upper and lower flanks or on the upper and lower flanks and the inner circumferential surface, and a hard film formed by ion plating on the outer circumferential surface.

DE 10 2005 023 627 A1 reveals a steel piston ring having a running surface chambered on one side, with the running surface being coated with a chromium-ceramics-based wear protection layer having micro-cracks and at least the flanks being provided with a wear-reducing nitrided layer.

DE 10 2005 011 438 B3 discloses a method for producing wear protection layers on a piston ring base body consisting of steel or case iron, with the running surface region being first provided at least in part with an at least single-layer thermal spray layer on the basis of nitrogen-affine metallic elements, and then at least the flanks and the running surface with the spray layer applied thereto are subjected to a nitriding process.

Even though such sliding elements have layers with satisfactory wear resistance, they either have no running surfaces with particularly low coefficients of friction or no sufficient adhesion between the substrate and the wear protection layer.

Furthermore, DLC coatings on running surfaces of piston rings are known from the prior art. Diamond-like carbon layers (DLC) constitute a metastable form of amorphous carbon with a significant portion of $sp^3$-hybridised carbon, which exhibit particularly favorable tribological properties.

A summary of the possible DLC layer systems can be found in the VDI Guideline 2840 *Carbon Layers*.

DE 10 2011 003 254 A1 discloses a sliding element where at least one running surface has, from the inside outwards, a coating with an adhesive layer containing metal and a ta-C-type DLC layer having a thickness of at least 10 µm. The basic material of the sliding element may or may not be nitrided.

Such sliding elements have a low coefficient of friction on the running surface, but are not sufficiently resistant to wear.

Known from DE 10 2011 014 483 B3 is a method for producing a steel piston ring in which a base body is produced that is provided with chambering on the side of the running surface, the running surface is directly provided with a wear-resistant layer and the circumferential and flank regions of the base body, which are not provided with the wear-resistant layer, are nitrided. The wear-resistant layer can consist of, inter alia, a DLC layer or a chromium layer, and a chromium layer can also be applied to the DLC layer.

Owing to the direct application of the DLC layer to the substrate of the running surface, however, the wear resistance of the sliding element is limited by the insufficient adhesion of the DLC layer to the running surface.

SUMMARY OF THE INVENTION

The invention is based on the object of providing a sliding element, preferably a piston ring, and a method for producing the same, which exhibits good overall resistance to wear as well as favorable tribological properties in the region of the running surface.

The surface hardening of the surfaces not constituting the running surface ensures the wear resistance thereof. As the outermost layer of the running surface, however, a DLC layer or a metal-based nitride layer is provided, which contributes to particularly advantageous tribological properties and wear behaviour of the running surface.

It has surprisingly become evident in various test series that substrates without a nitrided layer, which are provided with a DLC layer or a metal-based nitride layer, are considerably more resistant to a cyclic load simulating the knocking combustion than substrates having a nitrided layer beneath the DLC layer or the metal-based nitride layer.

Owing to the load, the substrate is plastically deformed, however, the brittleness of the nitrided layer results in the initiation of cracks in the nitrided region and the DLC layer. In a substrate without a nitrided layer, however, considerably higher tensions can be reduced by plastic deformation before the formation of cracks is initiated in the material. The DLC layer or metal-based nitride layer is elastically deformed owing to its layer thickness that is thin compared to the substrate.

Moreover, by applying a metal-containing intermediate layer, preferably a metal layer, particularly preferably a chromium layer, between the substrate and the DLC layer or the metal-based nitride layer, adhesion between the substrate and the DLC layer or the metal-based nitride layer can be significantly improved.

The structure of the coating on the running surface, namely a non-nitrided substrate surface on which at least one metal-containing intermediate layer as well as the outermost layer, a DLC layer or metal-based nitride layer are provided, ensures wear protection of the running surface with low coefficients of friction while the wear resistance of the surfaces not constituting the running surface is ensured by surface hardening.

The running surface preferably corresponds to the outer circumferential surface of a ring with polygonal cross-sectional area, preferably of a hollow cylinder or a hollow truncated cone, without chambering.

In the method according to the invention for producing the sliding element, the DLC layer or metal-based nitride layer is inevitably applied after application of the intermediate layer while the surface hardening of at least one surface not constituting the running surface can be performed prior to the application of the intermediate layer, after application of the intermediate layer but prior to the application of the DLC layer or metal-based nitride layer and/or after application of the DLC layer or metal-based nitride layer.

Preferred further developments of the sliding element according to the invention are described in the further claims.

According to an embodiment according to the invention, the running surface of the sliding element is not surface-hardened. Dispensing with surface hardening under the coating of the running surface considerably increases wear resistance since crack initiation can be significantly reduced analogously to the mechanism of action in the nitrided running surface.

Preferably, the metal-containing intermediate layers according to the invention constitute galvanic and/or PVD intermediate layers since these positively influence adhesion.

According to a further preferred embodiment, a metal-containing intermediate layer, preferably a galvanic intermediate layer, is directly adjacent to the substrate surface such that adhesion is further improved.

Particularly advantageous is a layer structure on the running surface, in which a metal-containing intermediate layer is located directly between the substrate and the DLC layer or the metal-based nitride layer. Such a structure has proven to be particularly advantageous for the adhesion of the coating.

Advantageously, a metal-containing intermediate layer, preferably a galvanic intermediate layer, has a layer thickness of 1 µm to less than 5 µm since this positively influences the service life of the coating.

A preferred embodiment of the method according to the invention for producing a sliding element provides that a metal-containing intermediate layer is applied using a galvanic process. By this, metal-containing intermediate layers can be deposited in a cost-efficient manner using simple methods.

Pursuant to the method according to the invention for producing a sliding element, a metal-containing intermediate layer and/or a metal-based nitride layer and/or a DLC layer is advantageously applied using a PVD process. Thus, layers having a defined layer thickness and chemical composition can be reliably deposited.

According to a further preferred embodiment, the surface-hardened surfaces do not have a coating even though they may indeed be coated in particular cases of application.

Metal-based nitride layers with nitrides of the following elements have proven to be particularly advantageous; Aluminium (Al), titanium (Ti), zirkonium (Zr), hafnium (Hf), vanadium (V), niobium (Nb), tantalum (Ta), chromium (Cr), molybdenum (Mo) and tungsten (W). The compositions CrN, CrN(O), VN and AlN are particularly preferred. Furthermore, three-component systems A-B-N are preferred, where A and B each is an element from the group Ti, Zr, Hf, V, Nb, Ta, Cr, Mo, W, Al, Si and C, and N is nitrogen. Particularly preferred are the Ti—Zr—N, Ti—Al—N, Cr—Si—N, Cr—Zr—N, Cr—Ti—N and Cr—V—N systems.

These can be stoichiometric phases or non-stoichiometric phases or mixtures thereof. The metal-based nitride layers can moreover comprise any combinations of the stated compositions, in particular these can also be provided in graded form. Furthermore, they may comprise droplets and be formed as a multi-layer system or with superlattice structures.

Moreover, the metal-based nitride layers of the following documents are provided as preferred variants:
DE102012200378 A1
DE102008017583 A1
DE102007027245 A1
DE102007035502 A1
DE102006046915 B3
DE102006046917 B3
DE102004032403 B3

DETAILED DESCRIPTION

According to a preferred embodiment, a steel piston ring is provided having an upper and a lower flank as well as an inner and an outer circumferential surface. The upper and lower flanks as well as the inner circumferential surface each have a nitrided layer that is introduced into the piston ring by plasma nitriding, bath nitriding or gas nitriding, for example. On the outer circumferential surface, which constitutes the running surface of the piston ring and is not nitrided, a coating is applied that consists of a first chromium intermediate layer, preferably having a layer thickness between 1 µm and 5 µm, and a second chromium intermediate layer and a DLC layer of the ta-C type. The first chromium intermediate layer is preferably applied onto the running surface by galvanic deposition, and the second chromium intermediate layer and the DLC layer are preferably deposited using a PVD process.

The invention claimed is:

1. A steel piston ring, comprising:
a running surface, an inner circumferential surface, an upper flank, and a lower flank;
the upper flank, the lower flank, and the inner circumferential surface each having a nitrided layer;
a coating disposed on a non-nitrided substrate base area of the running surface,
the coating including a metal-containing intermediate layer including chromium applied to the running surface, the metal-containing intermediate layer having a thickness between 1 µm and 5 µm, and an outermost layer comprising a DLC layer.

2. The steel piston ring according to claim 1, in which the running surface is not surface-hardened.

3. The steel piston ring according to claim 1, in which a further metal-containing intermediate layer is between the substrate surface and the metal-containing intermediate layer including chromium.

4. The steel piston ring according to claim 1 in which the metal-containing intermediate layer is located directly between the substrate and the DLC layer.

5. The steel piston ring according to claim 1, in which at least one metal nitride layer is provided between the outermost layer and the substrate surface.

6. A method for producing a steel piston ring according to claim 1, in which the DLC layer is deposited on the running surface of the sliding element and at least one further surface of the sliding element is surface-hardened while nitriding of the running surface is avoided.

7. The method according to claim 6, in which a further metal-containing intermediate layer is applied between the substrate surface and the metal-containing intermediate layer including chromium using a galvanic process.

8. The method according to claim 6, in which the metal-containing intermediate layer including chromium and/or the DLC layer are applied using a PVD process.

9. The steel piston ring according to claim 1, wherein said running surface comprises an outer circumferential surface of said piston ring.

10. The steel piston ring of claim 3, wherein said further metal-containing intermediate layer comprises a galvanic intermediate layer.

11. The steel piston ring according to claim 10, in which said further metal-containing intermediate layer has a layer thickness of 1 μm to less than 5 μm.

* * * * *